(12) United States Patent
Kim

(10) Patent No.: US 8,840,720 B2  
(45) Date of Patent: Sep. 23, 2014

(54) METHOD FOR MANUFACTURING A POLYCRYSTALLINE SILICON THIN FILM BY JOULE-HEATING INDUCED CRYSTALLIZATION

(75) Inventor: Cheol-Su Kim, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 956 days.

(21) Appl. No.: 12/962,990

(22) Filed: Dec. 8, 2010

(65) Prior Publication Data

US 2011/0306183 A1   Dec. 15, 2011

(30) Foreign Application Priority Data

Jun. 9, 2010   (KR) .................. 10-2010-0054406

(51) Int. Cl.
- *C30B 1/02* (2006.01)
- *C30B 29/06* (2006.01)
- *C23C 16/56* (2006.01)
- *H01L 21/02* (2006.01)
- *C23C 16/24* (2006.01)

(52) U.S. Cl.
CPC .......... *H01L 21/02532* (2013.01); *C30B 29/06* (2013.01); *C23C 16/56* (2013.01); *C30B 1/023* (2013.01); *H01L 21/02488* (2013.01); *H01L 21/02667* (2013.01); *C23C 16/24* (2013.01)

USPC ...................... 117/8; 117/7; 117/9; 117/200

(58) Field of Classification Search
CPC .............. C30B 1/00; C30B 1/02; C30B 1/023
USPC .......................... 117/7–9, 200, 906, 928, 930
See application file for complete search history.

(56) References Cited

U.S. PATENT DOCUMENTS

2009/0042342 A1   2/2009   Ro et al.

FOREIGN PATENT DOCUMENTS

| KR | 10-2007-0090849 | | 9/2007 |
| KR | 10-2007-0090849 | A * | 9/2007 |
| KR | 10-2009-0084237 | | 8/2009 |
| KR | 10-2009-0084237 | A * | 8/2009 |
| KR | 10-2009-0084239 | A | 8/2009 |

* cited by examiner

Primary Examiner — Michael Kornakov  
Assistant Examiner — Kenneth A Bratland, Jr.  
(74) Attorney, Agent, or Firm — Lee & Morse, P.C.

(57) ABSTRACT

An apparatus for manufacturing a polycrystalline silicon thin film, including a crystallization container filled with silicon oil, crystallization electrodes spaced apart from the crystallization container, and a conductive plate positioned between the crystallization electrodes and connected with the crystallization electrodes. Because an insulating layer between the amorphous silicon thin film and the conductive plate is formed by using silicon oil filled within the crystallization container, Joule-heating induced crystallization (JIC) can be performed through a simpler manufacturing process.

17 Claims, 4 Drawing Sheets

METHOD FOR MANUFACTURING A POLYCRYSTALLINE SILICON THIN FILM BY JOULE-HEATING INDUCED CRYSTALLIZATION

CROSS-REFERENCE TO RELATED APPLICATION

This application claims the benefit of Korean application No. 10-2010-0054406, filed on Jun. 9, 2010 in the Korean Intellectual Property Office, the disclosure of which is incorporated herein by reference.

BACKGROUND

1. Field

Aspects of the described technology relate generally to an apparatus and method for manufacturing a polycrystalline silicon thin film, and more particularly, to a Joule-heating crystallization apparatus and method.

2. Description of the Related Art

In general, amorphous silicon (a-Si) is disadvantageous in that it has low mobility of electrons, i.e., electric charge carriers, and has a low aperture ratio and is not appropriate for a CMOS process. Meanwhile, a polycrystalline silicon (poly-Si) thin film element is available for configuring a driving circuit, which is required for writing an image signal in pixels, on a substrate such as a pixel thin film transistor (TFT)-array, which is not possible with an amorphous silicon TFT. Thus, the polycrystalline silicon thin film element, in which connections between a plurality of terminals and a driver IC are not required, has high productivity and reliability and results in a smaller panel thickness.

Methods for manufacturing a polycrystalline silicon TFT include a method for manufacturing a polycrystalline silicon TFT in high temperature conditions and a method for manufacturing a polycrystalline silicon TFT in low temperature conditions. In order to form the polycrystalline silicon TFT in high temperature conditions, a high-priced material such as quartz or the like must be used as the material for a substrate, so the method for manufacturing a polycrystalline silicon TFT in high temperature conditions is not suitable for a large size. Thus, research for a method for manufacturing an amorphous silicon thin film with polycrystalline silicon in low temperature conditions is actively ongoing. Methods for forming polycrystalline silicon at a low temperature include solid phase crystallization (SPC), metal induced crystallization (MIC), metal induced lateral crystallization (MILC), excimer laser crystallization (ELC), Joule-heating induced crystallization (JIC), and the like.

In particular, JIC is a crystallization method in which a conductive thin film is disposed on or under an amorphous silicon thin film, to which an electric field is applied to perform Joule heating to thereby perform crystallization. In JIC, an insulating layer is deposited on the amorphous silicon thin film and then patterned, and a conductive thin film is deposited on the patterned insulating layer and amorphous silicon thin film to allow a portion of the conductive thin film to be in contact with the amorphous silicon thin film through the patterned portion of the insulating layer. This is to prevent arc generation when a voltage is applied thereto. An electric field is applied to the amorphous silicon thin film through electrode terminals installed at both ends of an upper surface of the conductive thin film, on which Joule heating is then performed to crystallize the amorphous silicon thin film.

That is, as mentioned above, JIC requires the process of patterning the insulating layer to allow the portion of the conductive thin film to be in contact with the amorphous silicon thin film in order to prevent arc generation in the case of a voltage application and the process of forming the conductive thin film in order to apply an electric field to the amorphous silicon thin film.

The above information disclosed in this Background section is only for enhancement of understanding of the background of the described technology, and therefore it may contain information that does not form the prior art that is already known in this country to a person of ordinary skill in the art.

SUMMARY

Aspects of the described technology have been made in an effort to provide an apparatus and method for manufacturing a polycrystalline silicon thin film having advantages of simplifying the manufacturing process.

An exemplary embodiment provides an apparatus for manufacturing a polycrystalline silicon thin film, including: a crystallization container filled with silicon oil; crystallization electrodes spaced apart from the crystallization container; and a conductive plate positioned between the crystallization electrodes and connected with the crystallization electrodes.

Resistance of the conductive plate may be higher than that of the crystallization electrodes.

The apparatus may further include a plurality of connection lines connecting the conductive plate and the crystallization electrodes.

Another exemplary embodiment provides a method for manufacturing a polycrystalline silicon thin film, including: forming an amorphous silicon thin film on a substrate; placing the substrate within a crystallization container filled with silicon oil; positioning a conductive plate connected with crystallization electrodes such that the conductive plate faces the amorphous silicon thin film; bringing the crystallization electrodes into contact with the amorphous silicon thin film; and applying a voltage to the crystallization electrodes to generate Joule heat to crystallize the amorphous silicon thin film.

An insulating layer formed of silicon oil may be formed between the conductive plate and the amorphous silicon thin film.

The Joule heat generated from the conductive plate may be transferred to the amorphous silicon thin film through the insulating layer to crystallize the amorphous silicon thin film.

The method may further include pre-heating the conductive plate connected with the crystallization electrodes before the crystallization electrodes are brought into contact with the amorphous silicon thin film.

According to these and/or other exemplary embodiments, because the insulating layer between the amorphous silicon thin film and the conductive plate is formed by using silicon oil filled within the crystallization container, Joule-heating induced crystallization (JIC) can be performed through a simpler manufacturing process.

Also, because the conductive plate connected with the crystallization electrodes is immersed in the crystallization container, a process for forming a conductive thin film to generate Joule heat is not required, so the manufacturing process is simplified and the manufacturing cost can be reduced.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings, of which.

DETAILED DESCRIPTION

Figure 1:
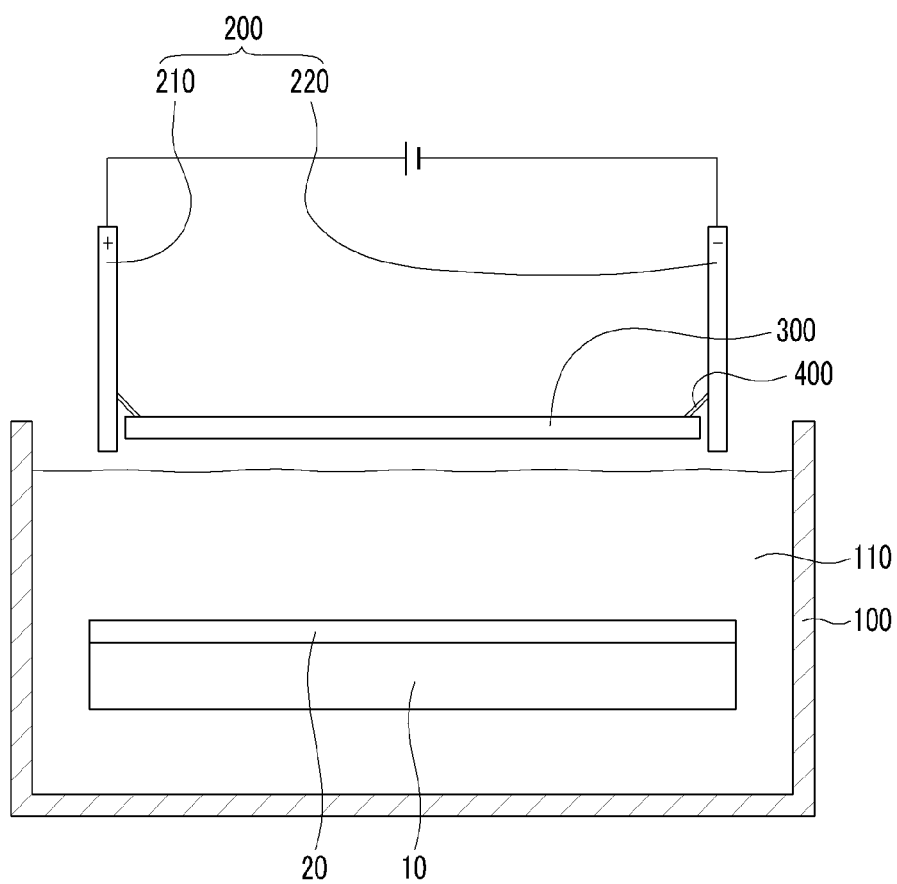
FIG. 1 is a side view of an apparatus for manufacturing a polycrystalline silicon thin film according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In order to clarify these aspects of the present invention, parts that are not connected with the description will be omitted, and the same elements or equivalents are referred to by the same reference numerals throughout the specification. The size and thickness of each element are arbitrarily shown in the drawings, and these aspects of the present invention are not necessarily limited thereto.

An apparatus for manufacturing a polycrystalline silicon thin film according to an exemplary embodiment will now be described with reference to FIGS. 1 and 2. FIG. 1 is a side view of an apparatus for manufacturing a polycrystalline silicon thin film according to an exemplary embodiment, and FIG. 2 is a plan view of the apparatus for manufacturing a polycrystalline silicon thin film according to the embodiment of FIG. 1.

Figure 2:
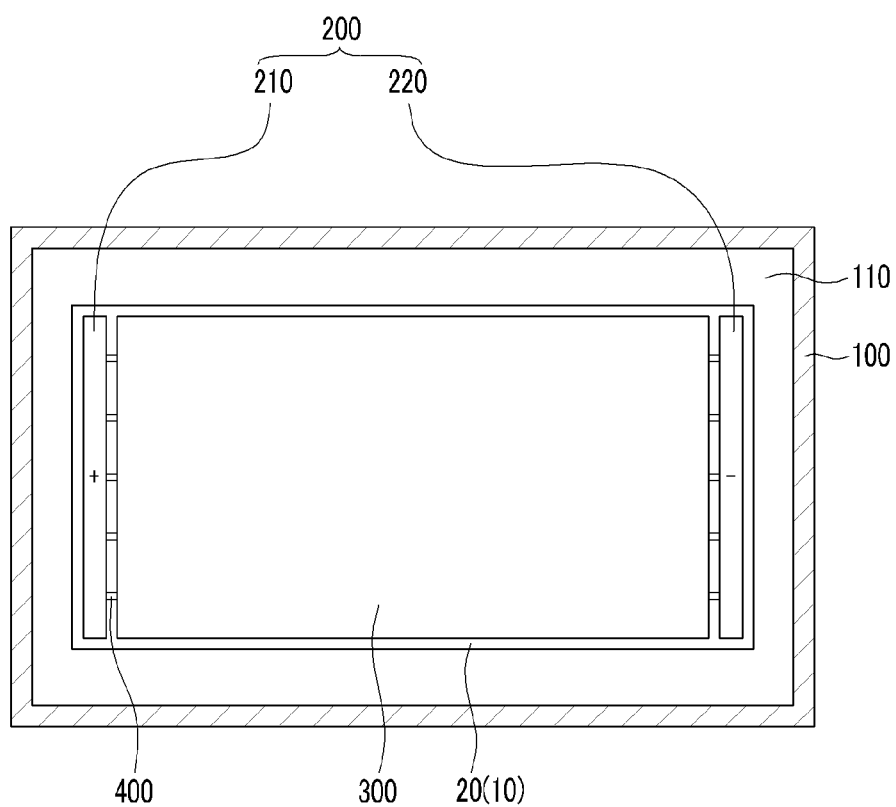
FIG. 2 is a plan view of the apparatus for manufacturing a polycrystalline silicon thin film according to the embodiment of FIG. 1.

As shown in FIGS. 1 and 2, the apparatus for manufacturing a polycrystalline silicon thin film includes a crystallization container 100 filled with silicon oil 110, crystallization electrodes 200 spaced apart from the crystallization container 100, and a conductive plate 300 positioned between the crystallization electrodes 200 and connected with the crystallization electrodes 200.

The crystallization container 100 may be made of a transparent substrate material such as glass, quartz, plastic, or the like, and the silicon oil 110 filled in the crystallization container 100 is a liquid silicon resin that has a low freezing point and exhibits a small change in viscosity as a function of temperature change.

The crystallization electrodes 200 include a positive electrode 210 and a negative electrode 220, and apply voltages to an amorphous silicon thin film 20. A portion of each of the crystallization electrodes 200 is immersed in the silicon oil 110, and when a voltage is applied to the amorphous silicon thin film 20, the amorphous silicon thin film 20 immersed in the silicon oil 110 and the crystallization electrodes 200 are brought into direct contact.

The conductive plate 300 may be formed to have a uniform thickness for uniform heating in the event of Joule heating according to voltage application. The conductive plate 300 is connected with the crystallization electrodes 200 through a plurality of connection lines 400, and resistance of the conductive plate 300 may be higher than that of the crystallization electrodes 200. Thus, when voltage is applied to the crystallization electrodes 200, the voltage is applied to the conductive plate 300 through the connection lines 400 and Joule heat is generated from the conductive plate 300 having high resistance.

A method for manufacturing a polycrystalline silicon thin film according to another exemplary embodiment by using the apparatus for manufacturing a polycrystalline silicon thin film as illustrated in FIGS. 1 and 2 will now be described in detail with reference to FIGS. 3 and 4.

Figure 3:
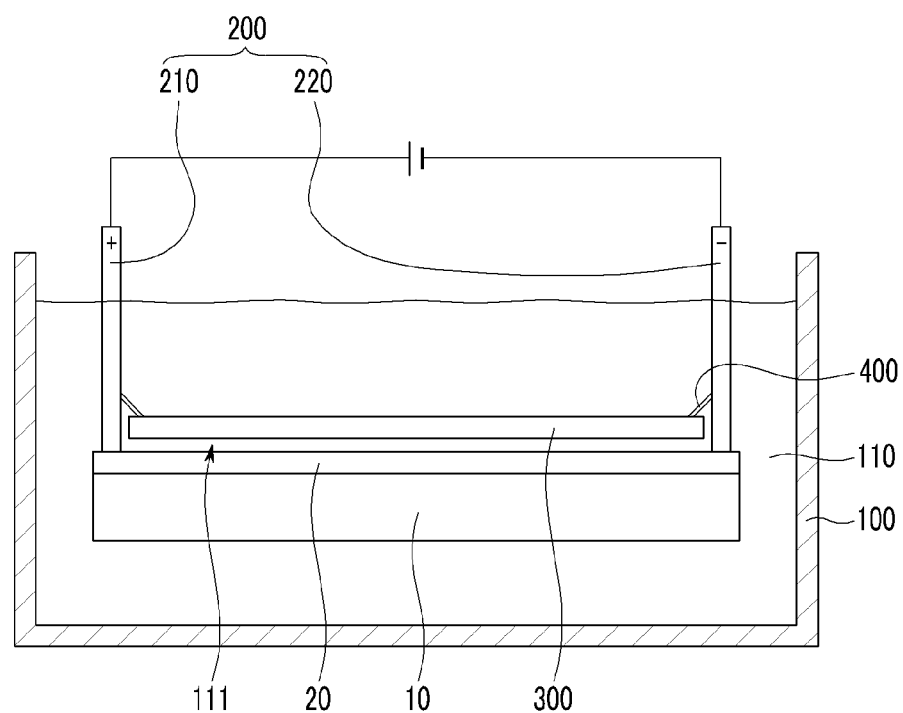
FIG. 3 is a side view showing how a polycrystalline silicon thin film is manufactured according to another exemplary embodiment by using the apparatus of FIGS. 1 and 2.
Figure 4:
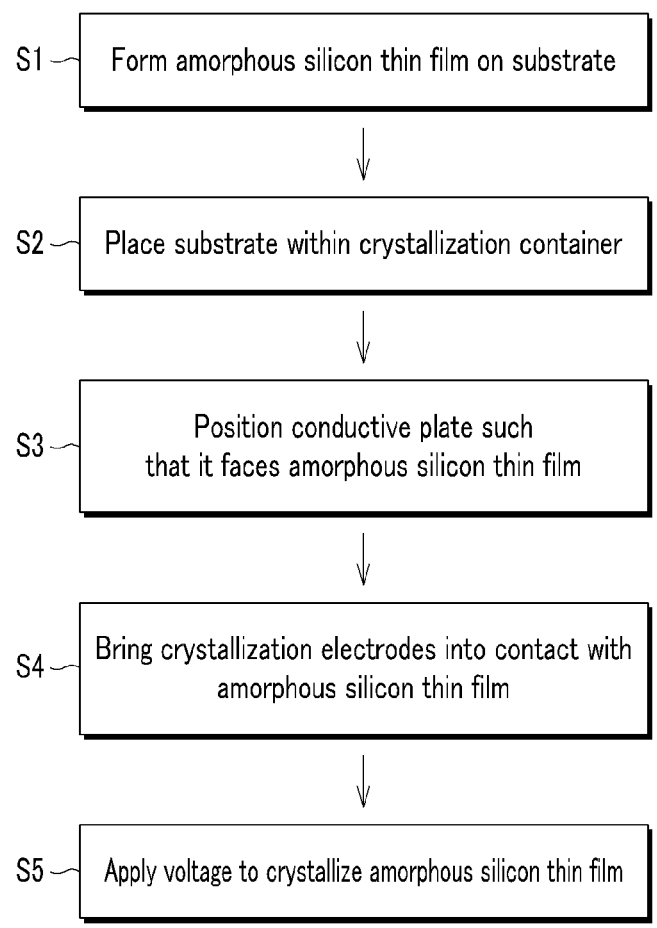
FIG. 4 is a flowchart illustrating the process of a method for manufacturing a polycrystalline silicon thin film according to the embodiment of FIG. 3.

FIG. 3 is a side view showing how a polycrystalline silicon thin film is manufactured by using the apparatus for manufacturing a polycrystalline silicon thin film according to this exemplary embodiment, and FIG. 4 is a flowchart illustrating the process of a method for manufacturing a polycrystalline silicon thin film according to this exemplary embodiment.

As shown in FIGS. 3 and 4, first, the amorphous silicon thin film 20 is formed on a substrate 10 (S1). The substrate 10 may be made of a transparent substrate material such as glass, quarts, plastic, or the like. The amorphous silicon thin film 20 may be formed through low pressure chemical vapor deposition, atmospheric pressure chemical vapor deposition, plasma enhanced chemical vapor deposition (PECVD), sputtering, vacuum evaporation, and the like, and preferably PECVD is used. The thickness of the amorphous silicon thin film 20 may range from about 300 Å to about 2000 Å, but is not limited thereto. The amorphous silicon thin film 20 may be a single Si thin film or may have a dual-layered structure including a-Si and normal-layer Si (n+ Si).

A buffer layer (not shown) may be formed between the substrate and the amorphous silicon thin film 20. The buffer layer is used to prevent some material in the interior of the substrate 10, e.g., an alkali material in the case of a glass substrate, from being eluted, and is formed by depositing silicon oxide ($SiO_2$) or silicon nitride. Preferably, the buffer layer has a thickness ranging from about 2000 Å to about 5000 Å, but the thickness of the buffer layer is not limited thereto.

Next, the substrate 10 is placed within the crystallization container 100 filled with the silicon oil 110 (S2). Accordingly, the substrate with the amorphous silicon thin film 20 formed thereon is immersed in the silicon oil 110.

Then, the conductive plate 300 connected with the crystallization electrodes 200 is positioned to face the amorphous silicon thin film 20 (S3). The conductive plate 300 has a sufficient area to cover most of the amorphous silicon thin film 20. Thus, a thin insulating layer 111 formed of the silicon oil 110 is formed between the conductive plate 300 and the amorphous silicon thin film 20. The insulating layer 111 serves to prevent the amorphous silicon thin film 20 from being contaminated by the conductive plate 300 in the crystallization process.

Thereafter, the crystallization electrodes 200 positioned above and spaced apart from the crystallization container 100 are brought into direct contact with the amorphous silicon thin film 20 on the substrate 10 (S4). Because the crystallization electrodes 200 are adjusted to have the same potential as that of the amorphous silicon thin film 20, arc generation between the conductive plate 300 and the amorphous silicon thin film 20 due to the thin insulating layer 111 formed between the conductive plate 300 and the amorphous silicon thin film 20 can be prevented.

A high voltage is then applied to the crystallization electrodes 200 to generate Joule heat from the conductive plate 300 to crystallize the amorphous silicon thin film 20 (S5). In applying the voltage to the conductive plate 300, energy of a power density that is sufficient to generate heat that is high enough to induce crystallization of the amorphous silicon thin film 20 through Joule heating is applied for a short time. Joule heating taking place from the conductive plate 300 according to the voltage application refers to heating with heat generated due to resistance when a current flows across a conductor. The energy content per unit hour applied to the conductive plate 300 by Joule heating according to the voltage application may be represented by the equation shown below.

$$W = V \times I$$

In the above equation, W indicates energy content per unit hour of Joule heating, V indicates voltage applied to both ends of the conductive plate 300, and I indicates current. In the above equation, it is noted that, as the voltage (V) increases or as the current (I) increases, the energy content per unit hour applied to the conductive plate 300 by Joule heating increases. When the temperature of the conductive plate 300 increases by Joule heating, heat conduction to the amorphous silicon thin film 20, the insulating layer 111, and the substrate 10 positioned below the conductive plate 300 occurs. Thus, the Joule heat generated from the conductive plate 300 is transferred to the amorphous silicon thin film 20 through the insulating layer 111, crystallizing the amorphous silicon thin film 20.

In this manner, because the insulating layer 111 is naturally formed between the amorphous silicon thin film 20 and the conductive plate 300 by using the silicon oil 110 filled in the crystallization container 100, Joule heating induced crystallization with a simpler manufacturing process can be obtained.

Also, because the conductive plate 300 connected with the crystallization electrodes 200 is immersed in the crystallization container 100, a process for forming a conductive thin film to generate Joule heat is not required, thus simplifying the manufacturing process and reducing the manufacturing cost.

On the other hand, before the crystallization electrodes 200 are brought into contact with the amorphous silicon thin film 20, the conductive plate 300 connected with the crystallization electrodes 200 may be pre-heated and then the voltage may be applied to the conductive plate 300. The pre-heating temperature refers to a temperature range in which the substrate 10 is not damaged during the general manufacturing process, and may be lower than a heat distortion temperature of the substrate 10. The pre-heating method is not particularly limited, and a method of using a general heat treating furnace or a method of irradiating with radiant heat such as a lamp or the like may also be used.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a polycrystalline silicon thin film, the method comprising:
    forming an amorphous silicon thin film on a substrate;
    placing the substrate within a crystallization container filled with silicon oil;
    positioning a conductive plate connected with crystallization electrodes such that the conductive plate faces the amorphous silicon thin film;
    bringing the crystallization electrodes into contact with the amorphous silicon thin film; and
    applying a voltage to the crystallization electrodes to generate Joule heat to crystallize the amorphous silicon thin film.

2. The method of claim 1, further comprising forming an insulating layer from silicon oil between the conductive plate and the amorphous silicon thin film.

3. The method of claim 2, wherein the Joule heat generated from the conductive plate is transferred to the amorphous silicon thin film through the insulating layer to crystallize the amorphous silicon thin film.

4. The method of claim 1, further comprising pre-heating the conductive plate connected with the crystallization electrodes before the crystallization electrodes are brought into contact with the amorphous silicon thin film.

5. The method of claim 1, wherein the amorphous silicon thin film is formed by a process selected from the group consisting of low pressure chemical vapor deposition, atmospheric chemical vapor deposition, plasma enhanced chemical vapor deposition, sputtering and vacuum evaporation.

6. The method of claim 5, wherein the amorphous silicon thin film is formed by plasma enhanced chemical vapor deposition.

7. The method of claim 1, wherein the amorphous silicon thin film has a thickness of 300 Å to about 2000 Å.

8. The method of claim 1, wherein the amorphous silicon thin film is a single silicon thin film or a dual-layered structure.

9. The method of claim 8, wherein the dual-layered structure is amorphous silicon (a-Si) and normal-layer silicon (n+Si).

10. The method of claim 1, further comprising forming a buffer layer between the substrate and the amorphous silicon thin film.

11. The method of claim 10, wherein the buffer layer is silicon oxide ($SiO_2$) or silicon nitride.

12. The method of claim 10, wherein the buffer layer has a thickness ranging from 2000 Å to about 5000 Å.

13. An apparatus for manufacturing a polycrystalline silicon thin film according to claim 1, the apparatus comprising:
    a crystallization container filled with silicon oil;
    crystallization electrodes spaced apart from the crystallization container; and
    a conductive plate positioned between the crystallization electrodes and connected with the crystallization electrodes.

14. The apparatus of claim 13, wherein the resistance of the conductive plate is higher than that of the crystallization electrodes.

15. The apparatus of claim 14, further comprising a plurality of connection lines connecting the conductive plate and the crystallization electrodes.

16. The apparatus of claim 13, wherein the silicon oil is a liquid silicon resin with a low freezing point and a small change in viscosity as a function of temperature change.

17. The apparatus of claim 13, wherein the conductive plate has a high resistance and a uniform thickness.

* * * * *